United States Patent [19]
Cho et al.

[11] Patent Number: 5,675,402
[45] Date of Patent: Oct. 7, 1997

[54] STEPPER LIGHT CONTROL USING MOVABLE BLADES

[75] Inventors: Chan Seob Cho; Hwan Soo Chang, both of Kyungki-Do; Myung Gun Gil, Daejun-shi, all of Rep. of Korea

[73] Assignee: Hyundai Electronics Industries Co., Ltd., Kyungki-Do, Rep. of Korea

[21] Appl. No.: 546,035

[22] Filed: Oct. 20, 1995

[30] Foreign Application Priority Data

Oct. 21, 1994 [KR] Rep. of Korea .............. 94-26970

[51] Int. Cl.[6] .............. G03B 27/72; G03B 27/52; G03B 27/54
[52] U.S. Cl. .............. 355/71; 355/67; 355/53; 355/54; 355/34; 355/35
[58] Field of Search .............. 355/67, 71, 53, 355/54, 34, 35

[56] References Cited

U.S. PATENT DOCUMENTS 4,702,592 10/1987 Geiger et al. .............. 355/53

FOREIGN PATENT DOCUMENTS 4-133308  5/1992  Japan .
5-251302  9/1993  Japan .

*Primary Examiner*—R. L. Moses
*Assistant Examiner*—Shival Virmani
*Attorney, Agent, or Firm*—Fish & Richardson, P.C.

[57] ABSTRACT

The present invention discloses a light control means in a stepper.

The light control means of the present invention has a twofold structure consisted of at least more than two blades which open a circuit pattern designed on a reticle; and a subblade which can close selectively a portion of the circuit pattern. The sub-blade is mounted above or below one of the at least more than two blades, and is movable in every directions in response to the instruction from the blade control system.

Accordingly, the present invention provides a exposure process which can selectively cover only the dies that will be overlapped with the EBR gap of the wafer using sub-blade, thereby increasing the number of the net-die.

3 Claims, 4 Drawing Sheets

STEPPER LIGHT CONTROL USING MOVABLE BLADES

FIELD OF THE INVENTION

The present invention relates to a light control means in a stepper formed of movable blades for manufacturing a semiconductor device, and particularly to the light control means in the stepper, which can increase the number of net-die that will be formed on the wafer by constructing the light control means into a twofold structure.

BACKGROUND OF THE INVENTION

A photoresist pattern is formed by a photoresist coating process, an exposure process and a development process. The exposure process is a process that transmits an image of the circuit pattern designed on the reticle onto the wafer. The light control means mounted in the stepper serves as opening or closing some portions of the reticle. The circuit pattern designed on the reticle is transmitted into the circuit pattern image on the wafer passing through opening region at the light control means.

FIG. 1 is a schematic illustration for the structure according to a conventional stepper.

A light control means 10 is mounted which constitutes a plurality of blades the direction of which is downward from a lamp 1 with its space being apart. The light control means 10 receives instruction from a blade control system 7, and as each of the blades moves automatically in response to the instruction, some portion of the reticle 2 is opened. Below the light control means 10 is positioned the reticle 2 on which a circuit pattern is designed. Below the reticle 2 is positioned a lens 3. A stage, positioned below from the lens 3 with its space being apart, constitutes a levelling stage 4 which controls the tilt of the wafer 20; Z-stage 5 that moves up and down; and X-Y stage 6 that moves horizontally.

FIG. 2 is a plain view showing which an image of the circuit pattern designed on the reticle is transmitted onto the wafer by exposure process using a conventional stepper.

A circuit pattern image 21 is transmitted onto the wafer 20 by an exposure process. As the exposure process continues, a plurality of the circuit pattern images 21 are formed on the wafer 20. An edge portion of the wafer 20 is called EBR gap (Edge Bead Removal gap) 22, and the EBR gap 22 is the portion from which SOG (Spin On Glass) widely used for the palnarization of topology pattern will be removed.

After certain circuit pattern is formed on the wafer 20, if the next process is a SOG coating process, a EBR process will be used so as to remove the SOG coating at the edge portion of the wafer 20. However, as shown in FIG. 2, if the circuit pattern image 21 is formed at the EBR gap 22 and then the circuit pattern same with the circuit pattern image 21 is formed at the EBR gap 22, during the EBR process it will have an adverse effects on the device because it will attack the below port on of the circuit pattern. Therefore, in the exposure process which is practiced at the previous step of the SOG coating process, it should not allow the EBR gap portion 22 in the wafer 20 to be exposed by using the light control element 10. In this case, it will cause a reduction in the number of net-die. This will be explained with reference to FIGS. 3A and 3B.

FIG. 3A is a plain view showing a conventional light control means.

A conventional light control means 10 has first and second blades 10A and 10B positioned facing with each other in horizontal direction, and third and fourth blades 10C and 10D positioned facing with each other in vertical direction. The first, second, third and fourth blades 10A, 10B, 10C and 10D each can move in every direction. Though it is not shown in the embodiment, the light control means 10 may be embodied in "l-type" blade and "L-type" blade.

FIG. 3B is drawing for status using a conventional light control means.

Each of the first, second, third and fourth blades 10A, 10B, 10C and 10D is moved to open a circuit pattern 31 designed on the reticle 2, and the image of the circuit pattern 31 is transmitted onto the wafer 20 by the exposure process, thereby forming the circuit pattern image 21 on the wafer 20. As the exposure process continues, a plurality of the circuit pattern images 21 are formed on the wafer 20. Although it will not cause a problem to form the circuit pattern images 21 on the entire portions of the wafer 20, it will cause a problem at the EBR gap 22 as explained above if the next process is a SOG coating process. To solve this problem the portion of the EBR gap 22 should be covered not to form the circuit pattern images 21 on it.

One circuit pattern 31 designed on the reticle 2 includes a plurality of dies; first through tenth dies 31A through 31J. When the second and fourth dies 31B and 31D are overlapping with the portion of the EBR gap 22 in the wafer 20, the dies 31B and 31D corresponding to the portion should not be exposed. In order to cover the second and fourth dies 31B and 31D of the portion, the second blade 10B or the third blade 10C must be moved. If the second blade 10B is moved the sixth, eighth and tenth dies 31F, 31H and 31J will be covered, and if the third blade 10C is moved the first and third dies 31A and 31C will be covered, thereby resulting in reduction in the number of the net-die as many number as the net-dies are covered. As such, the conventional light control means 10 could not cover selectively only the second and fourth dies 31B and 31D overlapping with the EBR gap 22, resulting in reduction in the number of the net-die.

SUMMARY OF THE INVENTION

The purpose of the present invention is to provide a light control means in a stepper which can selectively cover only the dies that will be overlapping with the EBR gap, thereby increasing the number of the net-die.

The light control means of the present invention for accomplishing the above purpose comprises at least more than two blades which open the circuit pattern designed on the reticle; and a sub-blade mounted overlapping with the at least more than two blades, which can close selectively the portion of the circuit pattern.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Figure 1:
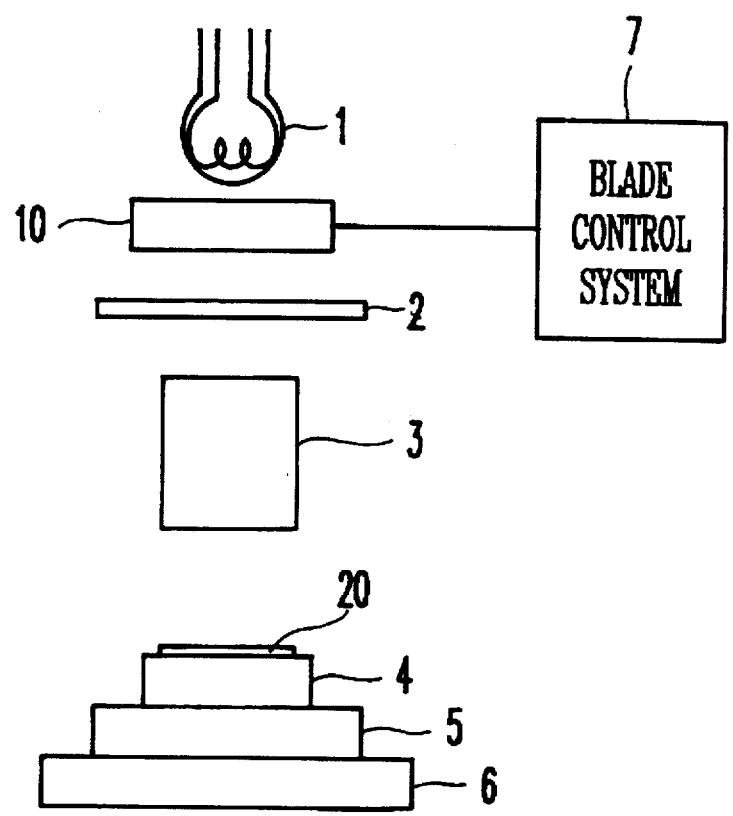
FIG. 1 is a schematic illustration for the structure of a conventional stepper.
Figure 2:
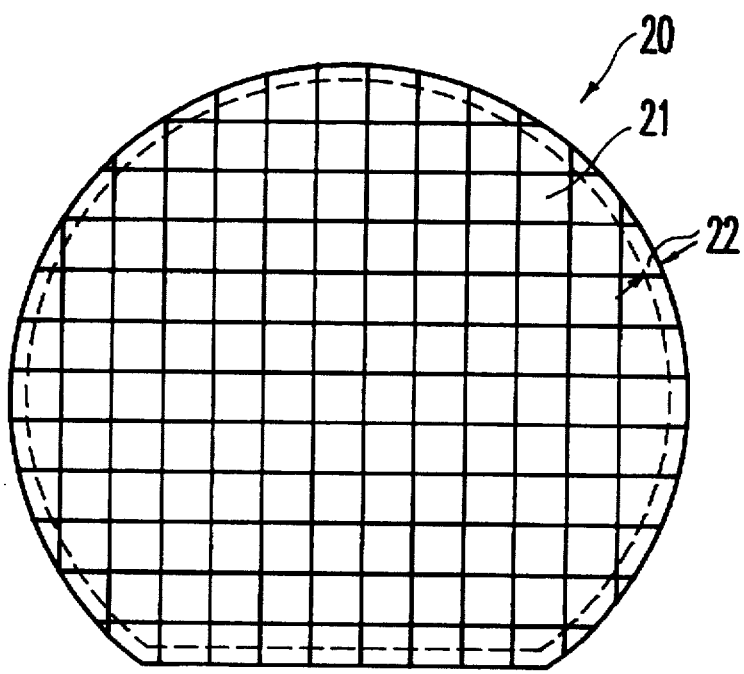
FIG. 2 is a plain view showing which an image of a circuit pattern designed on the reticle is transmitted onto the wafer by exposure process using a conventional stepper.
Figure 3A:
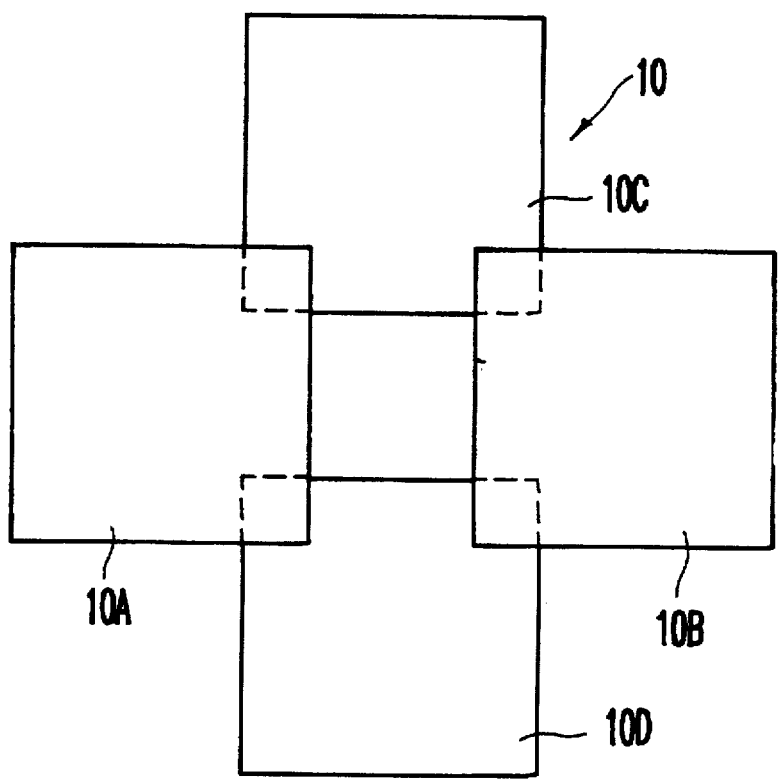
FIG. 3A is a plain view showing a conventional light control means.
Figure 3B:
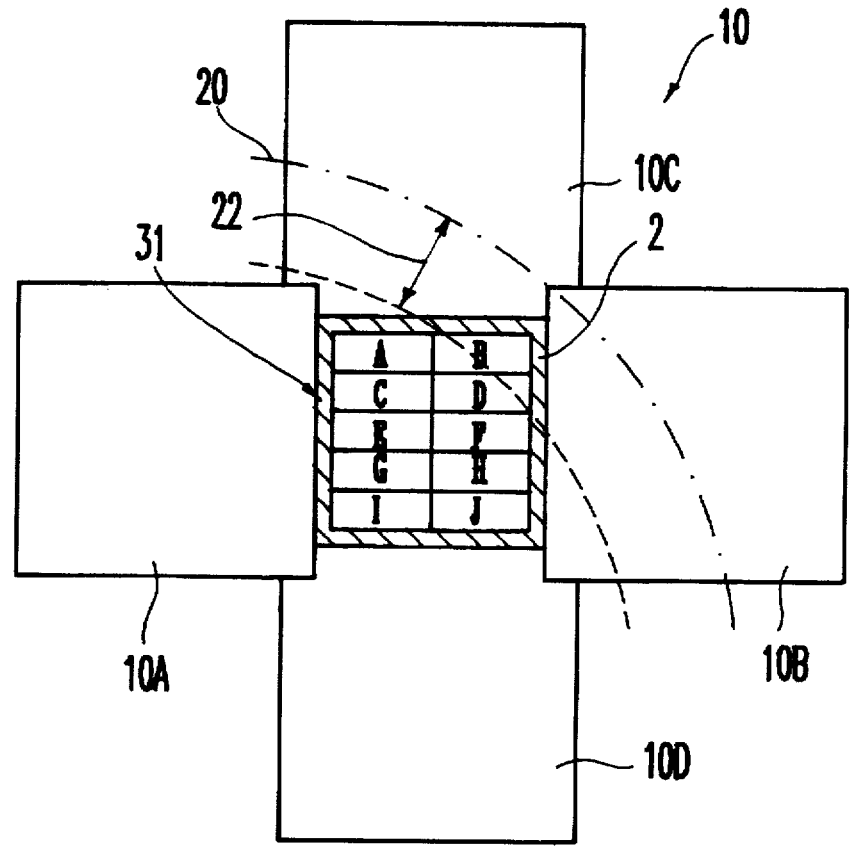
FIG. 3B is a drawing for status using a conventional light control means.
Figure 4:
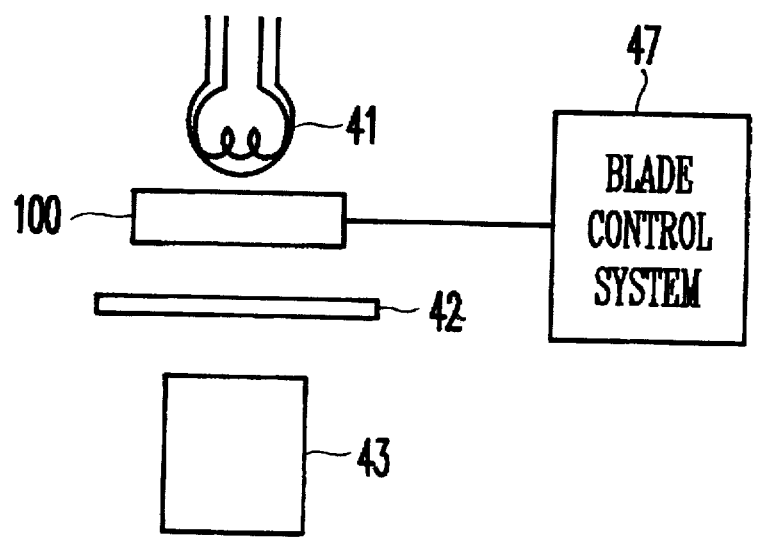
FIG. 4 is a schematic illustration for the structure of a stepper according to the present invention.

FIG. 4 is a schematic illustration for the structure of a stepper according to the present invention.

A light control means 100 is mounted which constitutes a plurality of blades the direction of which is downward from a lamp 41 with its space being apart. The light control means 100 receives instruction from a blade control system 47, and as each of the blades moves automatically in response to the instruction, some portions of a reticle 42 is opened. Below the light control means 100 is positioned the reticle 42 on which a circuit pattern is designed. Below the reticle 42 is positioned a lens 43. A stage, positioned below from the lens 43 with its space being apart, constitutes a levelling stage 44 which controls the tilt of a wafer 200; Z-stage 45 that moves up and down; and X-Y stage 46 that moves horizontally.

Figure 5:
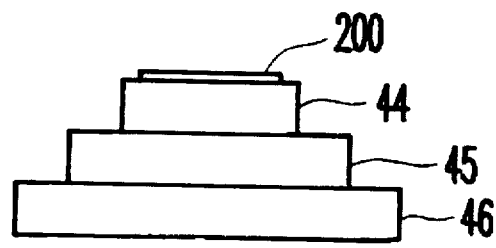
FIG. 5 is a plain view showing which an image of a circuit pattern designed on the reticle is transmitted onto the wafer by exposure process using a stepper of the present invention.
Figure 5:
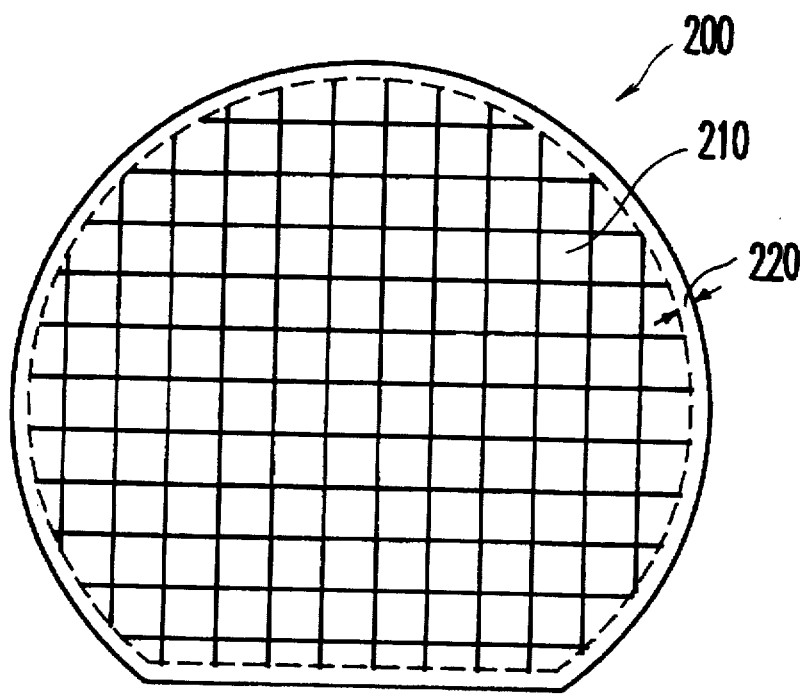

FIG. 5 is a plain view showing which an image of the circuit pattern designed on the reticle is transmitted onto the wafer by exposure process according to the present invention.

A circuit pattern image 210 is transmitted onto the wafer 200 by an exposure process. As the exposure process continues, a plurality of the circuit pattern images 210 are formed on the wafer 200. However, as show in FIG. 5, only on the portion of the EBR gap 220 in the wafer 200 is not formed the circuit pattern images 210.

Figure 6A:
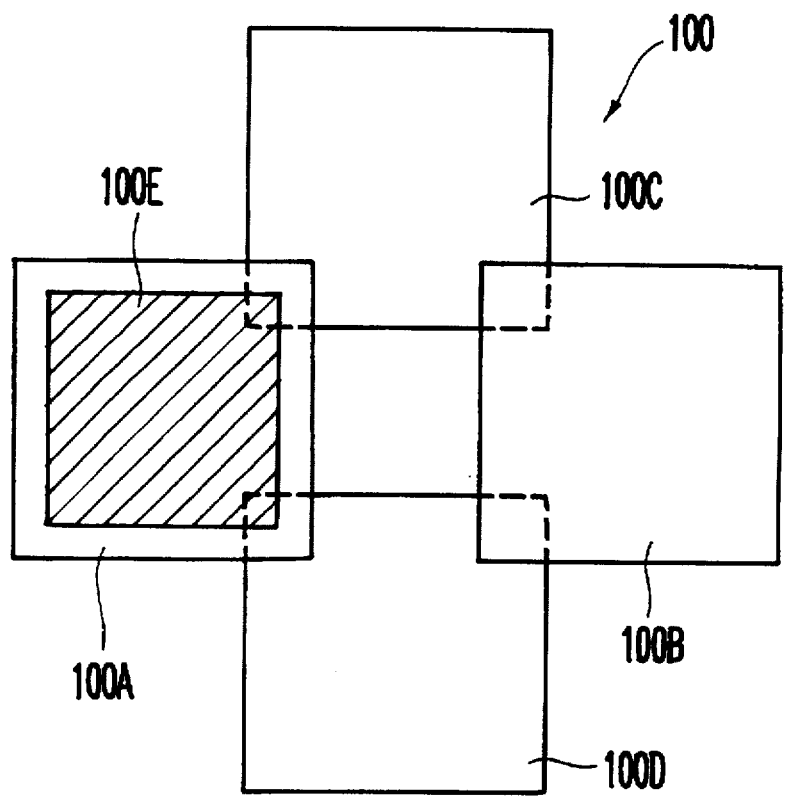
FIG. 6A is a plain view showing the light control means according to the present invention.

FIG. 6A is a plain view showing the light control means according to the present invention.

The light control means 100 of the present invention has a first and second blades 100A and 100B positioned facing with each other in horizontal direction, a third and fourth blades 100C and 100D positioned facing with each other in vertical direction, and includes a sub-blade 100E that will be mounted overlapping with the first, second, third and fourth blades 100A, 100B, 100C and 100D. That is, the light control means 100 of the present invention has a twofold structure.

Each of the first, second, third and fourth blades 100A, 100B, 100C and 100D can move in every directions, and it receives instruction from a blade control system 47 and servers as opening the circuit pattern 310 designed on the reticle 42. The subblade 100E also can move in every directions, and it receives instruction from the blade control system 47 and serves as closing selectively the portion of the circuit pattern 310 designed on the reticle 42. The size of the sub-blade 100E is larger than that of the circuit pattern 310 designed on the reticle 42, and it is mounted overlapping with either the top or the bottom of one of the first, second, third and fourth blades 100A, 100B, 100C and 100D.

Meanwhile, though the present invention explained the way in which the light control means 100 has the sub-blade 100E mounted on the four blades 100A, 100B, 100C and 100D that serves as opening the circuit pattern 310 designed on the reticle 42, even in case of at least two blades the present invention may be embodied by mounting the sub-blade 100E on them.

Figure 6B:
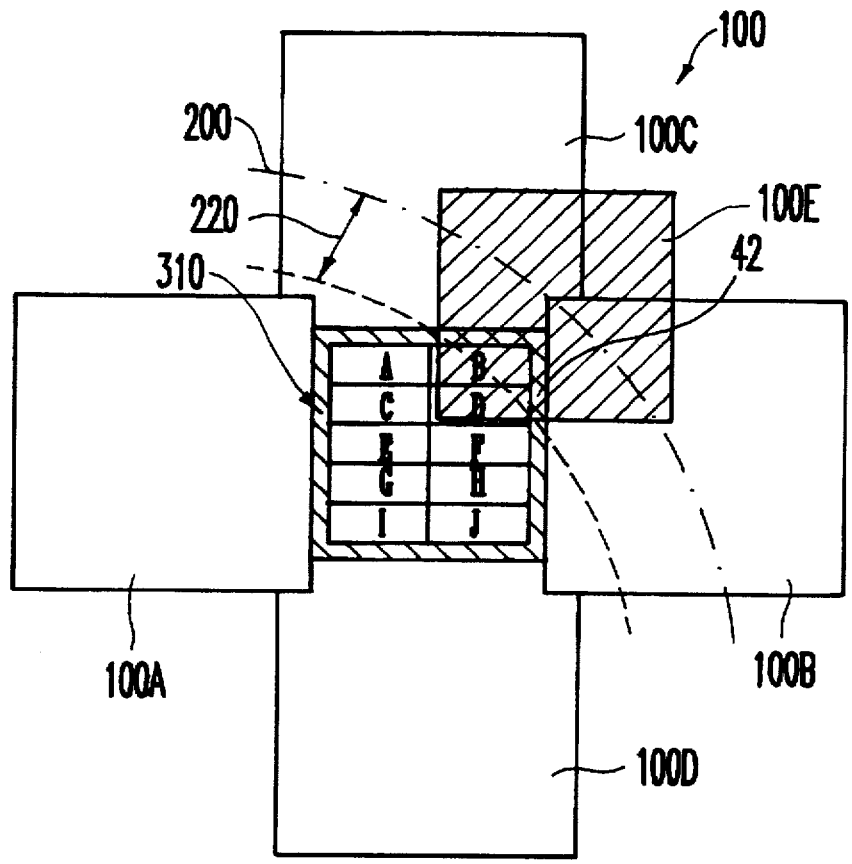
FIG. 6B is a drawing for status using the light control means according to the present invention.

FIG. 6B is a drawing for status using the light control means according to the present invention.

Each of the first, second, third and fourth blades 100A, 100B, 100C and 100D is moved to open the circuit pattern 310 designed on the reticle 42. The image of the circuit pattern 310 is transmitted onto the wafer 20 by exposure process, thereby forming the circuit pattern image 210 on the wafer 200. As the exposure process continues, a plurality of circuit pattern images 210 are formed on the wafer 200. Although it will not cause a problem to form the circuit pattern images 210 on the entire portions of the wafer 200, it will cause a problem at the EBR gap 220 as explained above if the next process is a SOG coating process. To solve this problem the portion of the EBR gap 220 must be covered not to form the circuit pattern images 210 on it.

One circuit pattern 310 designed on the reticle 42 includes a plurality of dies; first through tenth dies 310A through 310J. When the second and fourth dies 310B and 310D are overlapping with the portion of the EBR gap 220 in the wafer 200, the dies 310B and 310D corresponding to the portion should not be exposed. The dies 310B and 310D are covered by moving the sub-blade 100E without moving the second blade 100B or the third blade 100C. The sub-blade 100E automatically moves the coordination values to the dies that will be overlapped to cover that portion in response to the instruction from the blade control system 47.

As described above, the light control means of the present invention has a twofold structure which is made of at least more than two blades that open the circuit pattern designed on the reticle; and the sub-blade capable of closing selectively the portion of the circuit pattern.

Therefore, the present invention provides a sub-blade which can use an exposure process capable of selectively covering only the dies that will be overlapped with the EBR gap in the wafer, so it can increase the number of the net-die.

Although this invention has been described in its preferred embodiment with a certain degree of particularity, one skilled in the art should know that the preferred embodiment disclosed herein serves only as an example and that the construction, combination and arrangement of its parts may be varied without departing from the spirit and the scope of the invention.

What is claimed is:

1. A light control system in a stepper location near a pattern formed on a reticle comprising:

at least first and second blades, spatially arranged relative to each other, operable to move relative to each other and to select a portion of said pattern on said reticle to be exposed to a light beam; and a sub-blade mounted relative to said first and second blades, operable to move around in every direction and to overlap at least said first and second blades, thereby blocking a selected area in said pattern from said light beam.

2. The light control system of claim 1 wherein said sub-blade has a size larger than that of said pattern on said reticle.

3. A system as in claim 1, further comprising:

a third blade and a fourth blade, disposed relative to said first and second blades; and said sub-blade operable to overlap at least two of said first, second, third, and fourth blades.

* * * * *